(12) United States Patent
Momiuchi et al.

(10) Patent No.: US 11,171,170 B2
(45) Date of Patent: Nov. 9, 2021

(54) IMAGE SENSOR PACKAGE WITH FLEXIBLE PRINTED CIRCUITS

(71) Applicant: SONY CORPORATION, Tokyo (JP)

(72) Inventors: Yuta Momiuchi, Kanagawa (JP); Yuji Takaoka, Kanagawa (JP); Kiyohisa Tanaka, Kanagawa (JP); Eiichirou Kishida, Kumamoto (JP); Emi Nishioka, Nagasaki (JP); Naoki Yamashita, Kumamoto (JP); Hirokazu Seki, Oita (JP)

(73) Assignee: SONY CORPORATION, Tokyo (JP)

( * ) Notice: Subject to any disclaimer, the term of this patent is extended or adjusted under 35 U.S.C. 154(b) by 26 days.

(21) Appl. No.: 15/743,911

(22) PCT Filed: Jul. 14, 2016

(86) PCT No.: PCT/JP2016/070874
§ 371 (c)(1),
(2) Date: Jan. 11, 2018

(87) PCT Pub. No.: WO2017/018231
PCT Pub. Date: Feb. 2, 2017

(65) Prior Publication Data
US 2018/0204870 A1     Jul. 19, 2018

(30) Foreign Application Priority Data
Jul. 28, 2015 (JP) .............................. JP2015-148682

(51) Int. Cl.
*H01L 27/14* (2006.01)
*H01L 27/146* (2006.01)
(Continued)

(52) U.S. Cl.
CPC ........ *H01L 27/14636* (2013.01); *H01L 24/14* (2013.01); *H01L 24/16* (2013.01);
(Continued)

(58) Field of Classification Search
CPC .......... H01L 27/14618; H01L 23/3114; H01L 27/14636; H01L 24/14; H01L 24/16;
(Continued)

(56) References Cited

U.S. PATENT DOCUMENTS 6,819,387 B1 * 11/2004 Tamai ................. G02F 1/13452
349/149
6,909,173 B2 * 6/2005 Hamamoto ......... H01L 23/4985
257/690

(Continued)

FOREIGN PATENT DOCUMENTS

| CN | 1650426 A | 8/2005 |
|---|---|---|
| CN | 102365744 A | 2/2012 |

(Continued)

OTHER PUBLICATIONS

Sze et al., Physics of Semiconductor Devices, John Wiley & Sons, Inc. pp. 697-712 (Year: 2007).*

(Continued)

*Primary Examiner* — Shih Tsun A Chou
(74) *Attorney, Agent, or Firm* — Chip Law Group

(57) ABSTRACT

The present technology relates to a semiconductor device including: a solid-state image sensor having a pixel array unit in which a plurality of pixels each having a photoelectric conversion element is two-dimensionally arranged in a matrix; and a flexible printed circuit having wiring adapted to connect a pad portion provided on an upper surface side to be located on a light receiving surface side of the solid-state image sensor to an external terminal provided on a lower surface side opposite to the upper surface side, in which the flexible printed circuit is arranged along respective surfaces of the solid-state image sensor such that a
(Continued)

position of an end portion located on the upper surface side becomes a position different from a position in a space above the light receiving surface.

6 Claims, 10 Drawing Sheets

(51) Int. Cl.
    *H04N 5/225*     (2006.01)
    *H01L 23/00*     (2006.01)
    *H04N 5/335*     (2011.01)
    *H01L 23/31*     (2006.01)
    *H01L 23/498*     (2006.01)

(52) U.S. Cl.
    CPC .............. *H01L 24/32* (2013.01); *H01L 24/73* (2013.01); *H01L 24/92* (2013.01); *H01L 27/14* (2013.01); *H01L 27/14618* (2013.01); *H04N 5/2253* (2013.01); *H01L 23/3114* (2013.01); *H01L 23/3128* (2013.01); *H01L 23/4985* (2013.01); *H01L 23/49816* (2013.01); *H01L 23/49833* (2013.01); *H01L 2224/14155* (2013.01); *H01L 2224/16227* (2013.01); *H01L 2224/73253* (2013.01); *H01L 2224/92225* (2013.01); *H01L 2924/152* (2013.01); *H01L 2924/15159* (2013.01); *H04N 5/335* (2013.01)

(58) Field of Classification Search
    CPC ......... H01L 24/32; H01L 24/73; H01L 24/92; H01L 23/4985; H04N 5/2253; H04N 5/335; H04N 23/4985
    See application file for complete search history.

(56) References Cited

U.S. PATENT DOCUMENTS

| | | | |
|---|---|---|---|
| 9,402,303 B2 * | 7/2016 | Qian | ..................... G06F 1/1658 |
| 9,583,445 B2 * | 2/2017 | Dinh | ..................... H01L 23/552 |
| 2005/0104186 A1 * | 5/2005 | Yang | ................. H01L 27/14618 |
| | | | 257/688 |
| 2005/0161793 A1 | 7/2005 | Ohno et al. | |
| 2006/0087018 A1 * | 4/2006 | Chao | ..................... H01L 25/167 |
| | | | 257/680 |
| 2006/0261458 A1 | 11/2006 | Paek et al. | |
| 2008/0237767 A1 * | 10/2008 | Chan | ....................... H01L 24/11 |
| | | | 257/433 |
| 2010/0200898 A1 * | 8/2010 | Lin | ................... H01L 27/14618 |
| | | | 257/294 |
| 2015/0003083 A1 * | 1/2015 | Uehara | ................. H05K 1/056 |
| | | | 362/418 |

FOREIGN PATENT DOCUMENTS

| | | |
|---|---|---|
| JP | 2006-324304 A | 11/2006 |
| JP | 2012-517716 A | 8/2012 |
| KR | 10-2011-0115165 A | 10/2011 |
| TW | 200411892 A | 7/2004 |
| TW | 264775 U | 5/2005 |
| TW | 201044567 A | 12/2010 |
| WO | 2004/055891 A1 | 7/2004 |
| WO | 2010/093699 A1 | 8/2010 |

OTHER PUBLICATIONS

International Search Report and Written Opinion of PCT Application No. PCT/JP2016/070874, dated Sep. 27, 2016, 10 pages of ISRWO.

* cited by examiner

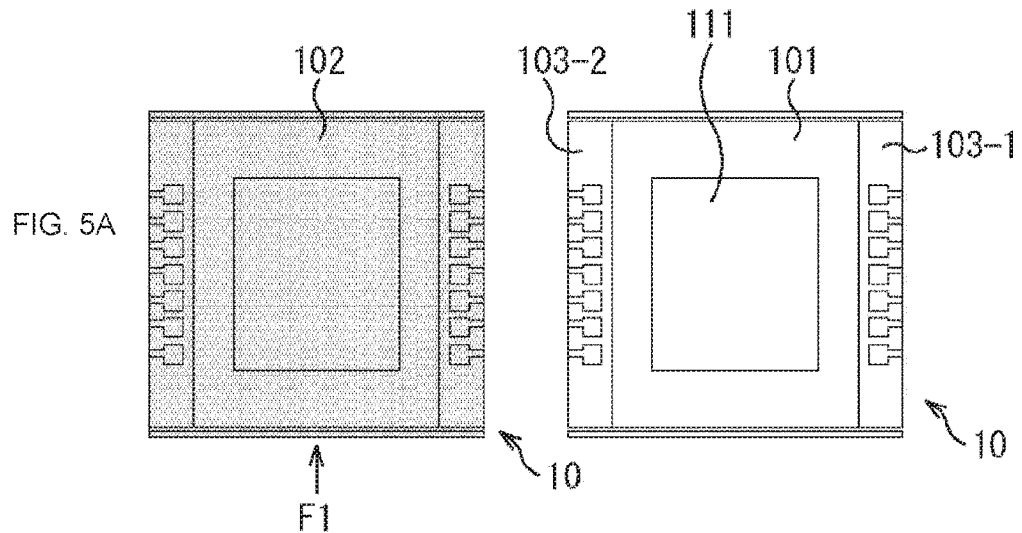
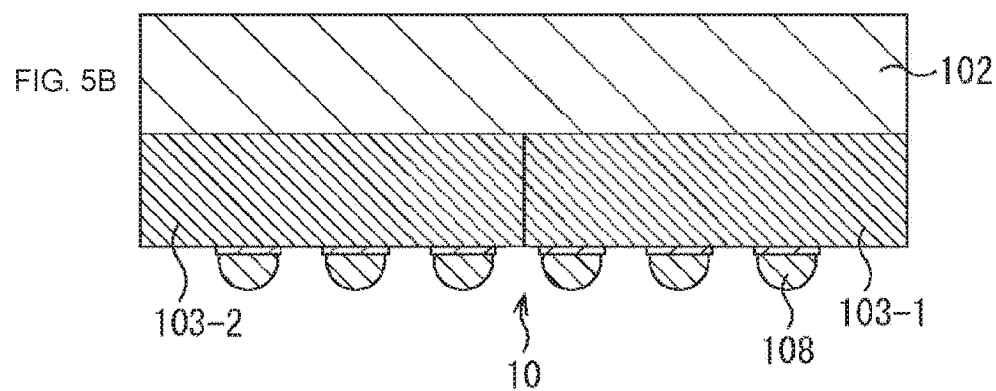
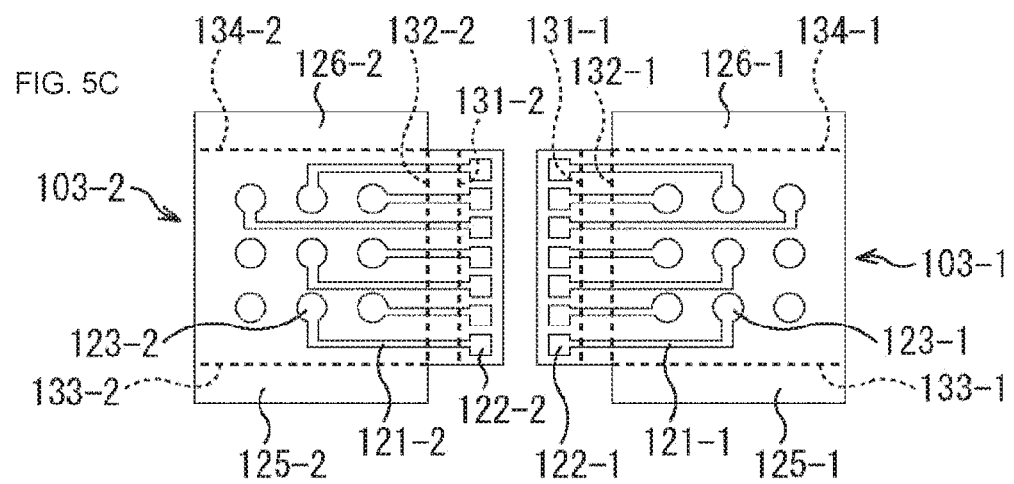

IMAGE SENSOR PACKAGE WITH FLEXIBLE PRINTED CIRCUITS

CROSS REFERENCE TO RELATED APPLICATIONS

This application is a U.S. National Phase of International Patent Application No. PCT/JP2016/070874 filed on Jul. 14, 2016, which claims priority benefit of Japanese Patent Application No. JP 2015-148682 filed in the Japan Patent Office on Jul. 28, 2015. Each of the above-referenced applications is hereby incorporated herein by reference in its entirety.

TECHNICAL FIELD

The present technology relates to a semiconductor device, a manufacturing method for the same, and an electronic apparatus, and particularly relates to a semiconductor device, a manufacturing method for the same, and an electronic apparatus, in which a chip size package can be more easily achieved by using flexible printed circuits.

BACKGROUND ART

There is a known technology called chip on film (COF) in which a semiconductor chip such as an IC chip or the like is directly mounted on flexible printed circuits (FPC) in a semiconductor device (semiconductor package). For example, disclosed is a technology in which a chip for an image sensor is mounted on a flexible printed circuit in which a hole is included at a center portion and a circuit pattern is formed (refer to Patent Document 1, for example).

CITATION LIST

Patent Document

Patent Document 1: Japanese Patent Application Laid-Open No. 2006-324304

SUMMARY OF THE INVENTION

Problems to be Solved by the Invention

In above-described Patent Document 1, it is necessary to provide an opening in a flexible printed circuit in order to expose a light receiving surface of a pixel region in a solid-state image sensor, and therefore, a technology to more easily achieve a chip size package (CSP) is required using the flexible printed circuits.

The present technology is made in view of such circumstances and directed to more easily achieving a chip size package by using a flexible printed circuit.

Solutions to Problems

A semiconductor device according to an aspect of the present technology includes: a solid-state image sensor having a pixel array unit in which a plurality of pixels each having a photoelectric conversion element is two-dimensionally arranged in a matrix; and a flexible printed circuit having wiring adapted to connect a pad portion provided on an upper surface side to be located on a light receiving surface side of the solid-state image sensor to an external terminal provided on a lower surface side opposite to the upper surface side. In the semiconductor device, the flexible printed circuit is arranged along respective surfaces of the solid-state image sensor such that a position of an end portion located on the upper surface side becomes a position different from a position in a space above the light receiving surface.

A manufacturing method for a semiconductor device according to an aspect of the present technology includes: fixing a flexible printed circuit to a transparent member adapted to transmit light incident on a light receiving surface, the flexible printed circuit having wiring adapted to connect a pad portion provided on an upper surface side to be located on a light receiving surface side of a solid-state image sensor to an external terminal provided on a lower surface side opposite to the upper surface side; electrically connecting the pad portion provided in the solid-state image sensor to the wiring of the flexible printed circuit; bending the flexible printed circuit along respective surfaces of the solid-state image sensor such that a position of an end portion located on the upper surface side becomes a position different from a position in a space above the light receiving surface, and further fixing a surface located on the lower surface side of the solid-state image sensor to the lower surface of the solid-state image sensor; and mounting the external terminal on the flexible printed circuit.

An electronic apparatus according to an aspect of the present technology includes a semiconductor device including: a solid-state image sensor having a pixel array unit in which a plurality of pixels each having a photoelectric conversion element is two-dimensionally arranged in a matrix; and a flexible printed circuit having wiring adapted to connect a pad portion provided on an upper surface side to be located on a light receiving surface side of the solid-state image sensor to an external terminal provided on a lower surface side opposite to the upper surface side, in which the flexible printed circuit is arranged along respective surfaces of the solid-state image sensor such that a position of an end portion located on the upper surface side becomes a position different from a position in a space above the light receiving surface.

In the semiconductor device, manufacturing method for the same, and electronic apparatus according to one aspect of the present technology, the solid-state image sensor includes the pixel array unit in which the plurality of pixels each having a photoelectric conversion element is two-dimensionally arranged in a matrix, and the flexible printed circuit the having the wiring adapted to connect the pad portion provided on the upper surface side to be located on the light receiving surface side of the solid-state image sensor to the external terminal provided on the lower surface side opposite to the upper surface side, in which the flexible printed circuit is arranged along respective surfaces of the solid-state image sensor such that the position of the end portion located on the upper surface side becomes the position different from the position in the space above the light receiving surface.

Effects of the Invention

According to one aspect of the present technology, the chip size package can be more easily achieved by using the flexible printed circuits.

Note that effects recited herein are not necessarily limited and may be any one of those recited in the present disclosure.

BRIEF DESCRIPTION OF DRAWINGS

FIGS. 5A, 5B, and 5C are views to describe a structure of a semiconductor device according to a second embodiment.

MODE FOR CARRYING OUT THE INVENTION

Figure 1:
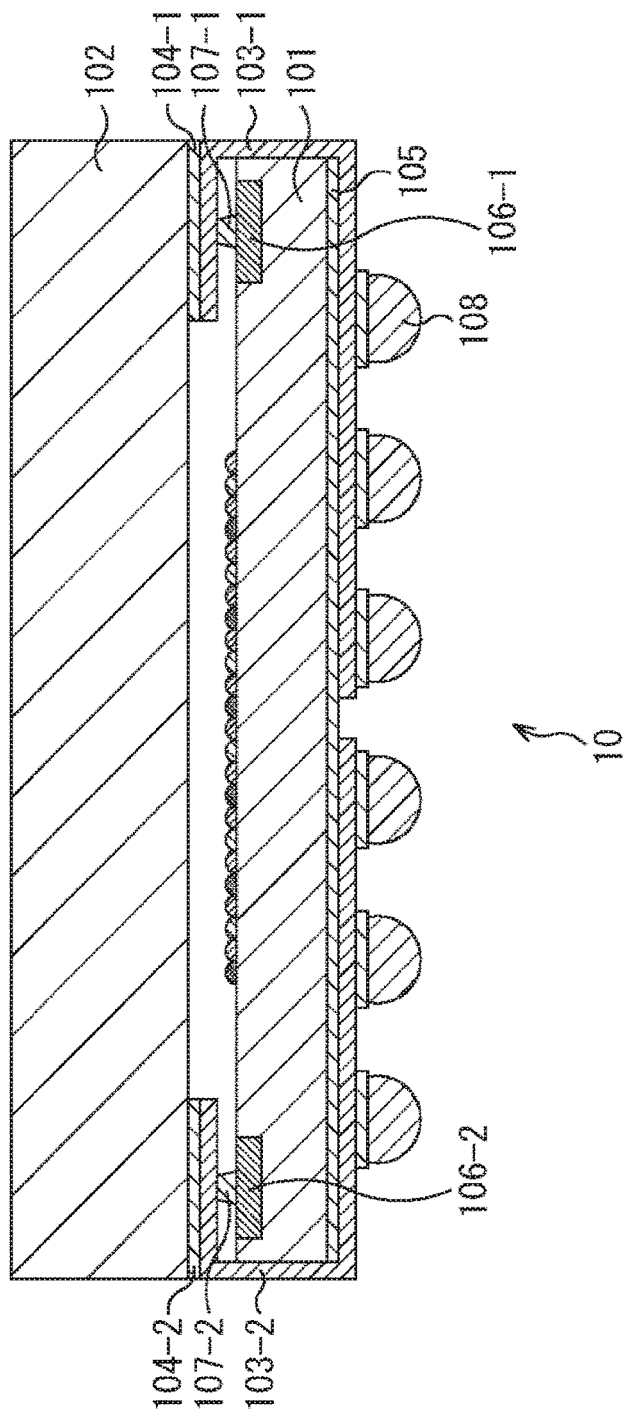
FIG. 1 is a cross-sectional view illustrating a cross section of a semiconductor device of a first embodiment.

In the following, embodiments of the present technology will be described with reference to the drawings. Note that a description will be provided in the following order.

1. First embodiment: semiconductor device having a basic structure
2. Second embodiment: semiconductor device having a four side surface flexible sealing structure
3. Third embodiment: semiconductor device having a four side surface flexible arc structure
4. Configuration of electronic apparatus
5. Exemplary uses of semiconductor device 1. First Embodiment (Structure of Semiconductor Device)

FIG. 1 is a cross-sectional view illustrating a cross section of a semiconductor device 10 of a first embodiment.

In the following description, note that a surface on which light is incident will be referred to as an upper surface (front surface) and a surface opposite to the front surface will be referred to as a lower surface (back surface) as for respective members in the semiconductor device 10 for convenience of description. Additionally, note that a surface on a left side out of four side surfaces of the semiconductor device 10 (solid-state image sensor 101) will be referred to as a left side surface, a surface on a right side will be referred to as a right surface, a surface on a near side as a front side surface, and a surface on a deeper side as a back side surface for convenience of description.

In FIG. 1, the semiconductor device 10 is a semiconductor package in which the solid-state image sensor 101 is housed and packaged. The semiconductor device 10 includes a solid-state image sensor 101, a transparent member 102, a flexible printed circuit 103-1, a flexible printed circuit 103-2, an adhesive 104-1, an adhesive 104-2, an adhesive 105, a pad portion 106-1, a pad portion 106-2, a bump 107-1, a bump 107-2, and a plurality of external terminals (ball grid array (BGA)) 108.

The solid-state image sensor 101 is, for example, an image sensor such as a complementary metal oxide semiconductor (CMOS) image sensor or a charge coupled device (CCD) image sensor. The solid-state image sensor 101 includes: a pixel array unit in which a plurality of pixels each having a photoelectric conversion element (for example, a photodiode) is two-dimensionally arranged in a matrix; and peripheral circuit units adapted to drive a pixel, perform analog/digital (A/D) conversion, and the like.

The flexible printed circuit 103-1 can be used in a deformed state because a thin and flexible material is used as an insulating base material. In FIG. 1, the flexible printed circuit 103-1 is bent along respective surfaces (upper surface, right side surface, and lower surface) of the solid-state image sensor 101.

Additionally, the flexible printed circuit 103-1 has wiring (redistribution layer (RDL)) to connect the (conductive) bump 107-1 formed on the pad portion 106-1 provided on the upper surface (front surface) side of the solid-state image sensor 101 to the plurality of external terminals (BGAs) 108 provided on the lower surface (back surface) side of the solid-state image sensor 101.

Similar to the flexible printed circuit 103-1, the flexible printed circuit 103-2 has wiring (redistribution layer (RDL)) to connect the (conductive) bump 107-2 formed on the pad portion 106-2 of the solid-state image sensor 101 to the plurality of external terminals (BGAs) 108, and is bent along respective surfaces (upper surface, left side surface, and lower surface) of the solid-state image sensor 101 so as to become symmetric with the flexible printed circuit 103-1.

In the flexible printed circuit 103-1 and the flexible printed circuit 103-2 bent in the above-described states, the transparent member 102 is bonded (fixed) to a surface along the upper surface (front surface) of the solid-state image sensor 101 with the adhesive 104-1 and the adhesive 104-2. Note that a cover glass, an IR filter, or the like can be used as the transparent member 102, for example.

Additionally, a terminal (terminal 122-1 in FIG. 3A) provided on a surface of the flexible printed circuit 103-1 on an opposite side of the surface to which the transparent member 102 is bonded is electrically connected to the bump 107-1 formed on the pad portion 106-1 of the solid-state image sensor 101. In a similar manner, a terminal (terminal 122-2 in FIG. 3A) provided on a surface of the flexible printed circuit 103-2 on an opposite side of the surface to which the transparent member 102 is bonded is electrically connected to the bump 107-2 formed on the pad portion 106-2 of the solid-state image sensor 101.

Furthermore, the solid-state image sensor 101 is bonded (fixed) to surfaces included in the flexible printed circuit 103-1 and the flexible printed circuit 103-2 and extending along the lower surface (back surface) of the solid-state image sensor 101 with the adhesive 105. Additionally, the plurality of external terminals (BGAs) 108 is electrically connected to terminals (terminals 123-1 and 123-2 in FIG. 3A) provided on the surfaces included in the flexible printed circuit 103-1 and the flexible printed circuit 103-2 and located on an opposite side of the surface to which the solid-state image sensor 101 is bonded.

In the semiconductor device 10 having the above structure, light from a subject passes through the transparent member 102 and is made incident on a light receiving surface of the solid-state image sensor 101, and a signal corresponding (a light amount of) the incident light is output from the plurality of external terminals (BGAs) 108 via the wiring formed in the flexible printed circuits 103-1 and 103-2 respectively bent from the pad portions 106-1 and 106-2 to the side surfaces (right side surface and left side surface) and the lower surface (the back surface) of the solid-state image sensor 101.

Additionally, the flexible printed circuit 103-1 and the flexible printed circuit 103-2 arranged along the surface (upper surface) located on the light receiving surface side of the solid-state image sensor 101 are bent such that end portions of these flexible printed circuits do not cover above the light receiving surface (do not block the incident light), in order words, such that the positions of the end portions become positions different from a position in a space above the light receiving surface. Therefore, in the semiconductor device 10, the incident light is not blocked by the flexible printed circuit 103-1 and the flexible printed circuit 103-2, and there is no need to provide openings at the flexible printed circuit 103-1 and the flexible printed circuit 103-2. In other words, in the semiconductor device 10, since it is only to bend the flexible printed circuits 103-1 and 103-2 from the upper surface (front surface) to the side surfaces (right side surface and left side surface) and the lower surface (back surface) of the solid-state image sensor 101, a chip size package (CSP) can be more easily achieved by the flexible printed circuits 103-1 and 103-2.

For example, in a chip size package in the related art, it is necessary to use a wafer technology such as a through silicon via (TSV) or the like in order to provide wiring from a pad portion on an upper surface (front surface) of a solid-state image sensor to an external terminal (BGA) formed on a lower surface (back surface) of the solid-state image sensor. On the other hand, in the semiconductor device 10 of FIG. 1, the chip size package can be achieved without using the wafer technology such as the through silicon via (TSV) because the flexible printed circuits 103-1 and 103-2 are used. Therefore, there is no peculiar problem such as peeling of a redistribution layer (RDL) or corrosion of a pad portion (Al pad) caused by the through silicon via (TSV), and therefore, yield can be more improved compared in the case of the chip size package in the related art.

Furthermore, for example, in a chip on film (COF) in the related art, it is necessary to provide a flexible printed circuit with an opening in order to expose a light receiving surface of a solid-state image sensor as disclosed in Patent Document 1 described above. In the case of providing the flexible printed circuit with the opening, the number of pieces that can be taken out from a worksheet may be more reduced at the time of manufacturing the flexible printed circuit, compared to a flexible printed circuit without having an opening. Furthermore, since a wide opening is needed to be provided for a solid-state image sensor having a large ratio of a light receiving surface (pixel region) to a chip area, a size of the flexible printed circuit is needed to be enlarged according thereto. As a result, there is a possibility that a size of a semiconductor device (semiconductor package) becomes larger than a size of the solid-state image sensor (chip for the image sensor).

On the other hand, in the semiconductor device 10 of FIG. 1, there is no need to provide openings at the flexible printed circuits 103-1 and 103-2. Additionally, in the semiconductor device 10 of FIG. 1, even in a case of using the solid-state image sensor 101 (chip for the image sensor) having a large ratio of the light receiving surface (pixel region) to a chip area and using more multiple pins compared to the chip on film in the related art, a width in each of the flexible printed circuits 103-1 and 103-2 never become larger than a width of the solid-state image sensor 101, and therefore, any kind of the solid-state image sensor 101 (chip for the image sensor) can be housed.

Furthermore, in the semiconductor device 10 of FIG. 1, it is only to bend the flexible printed circuits 103-1 and 103-2 from the upper surface (front surface) to the side surfaces (right side surface and left side surface) and the lower surface (back surface) of the solid-state image sensor 101, and furthermore, the plurality of external terminals (BGAs) 108 is formed on the lower surface (back surface) side of the solid-state image sensor 101, and therefore, the size of the semiconductor device 10 (semiconductor package) and the size of the solid-state image sensor 101) become substantially equal. As a result, since the size of the semiconductor device 10 can be made substantially equal to the size of the solid-state image sensor 101, the semiconductor device 10 can be miniaturized. Additionally, since a layout of the redistribution layer (RDL) is more simplified than that of the chip on film in the related art, a cost to prepare the flexible printed circuits 103-1 and 103-2 can be reduced.

Furthermore, in the chip on film in the related art, in a case of adopting a layout to form a redistribution layer (RDL) on the outside or the lower surface (back side) of the solid-state image sensor from one side of the solid-state image sensor (chip for the image sensor), it is necessary to provide high-density wiring in the vicinity of the light receiving surface (pixel region) and also the redistribution layer (RDL) is elongated, and therefore, signal delay, signal attenuation, power consumption increase, and the like may be caused. On the other hand, in the semiconductor device 10 of FIG. 1, adopted is the structure in which the flexible printed circuits 103-1 and 103-2 are bent from the upper surface (front surface) to the side surfaces (right side surface and left side surface) and the lower surface (back surface) of the solid-state image sensor 101, and therefore, the redistribution layer (RDL) can be minimized, and risks such as signal delay, signal attenuation, power consumption increase, and the like can be reduced.

In the following description, note that the flexible printed circuit 103-1 and the flexible printed circuit 103-2 will be each referred to as a flexible printed circuit 103 unless otherwise it is particularly necessary to distinguish one from the other. Additionally, in a case where it is not necessary to distinguish the pad portion 106-1 from the pad portion 106-2, these pad portions will be each referred to as a pad portion 106, and in a case of it is not necessary to distinguish the bump 107-1 from the bump 107-2, these bumps will be each referred to as a bump 107.

(Flow of Manufacturing Processes of Semiconductor Device)

Next, a flow of the manufacturing processes of the semiconductor device 10 of the first embodiment will be described with reference to a flowchart of FIG. 2.

Figure 2:
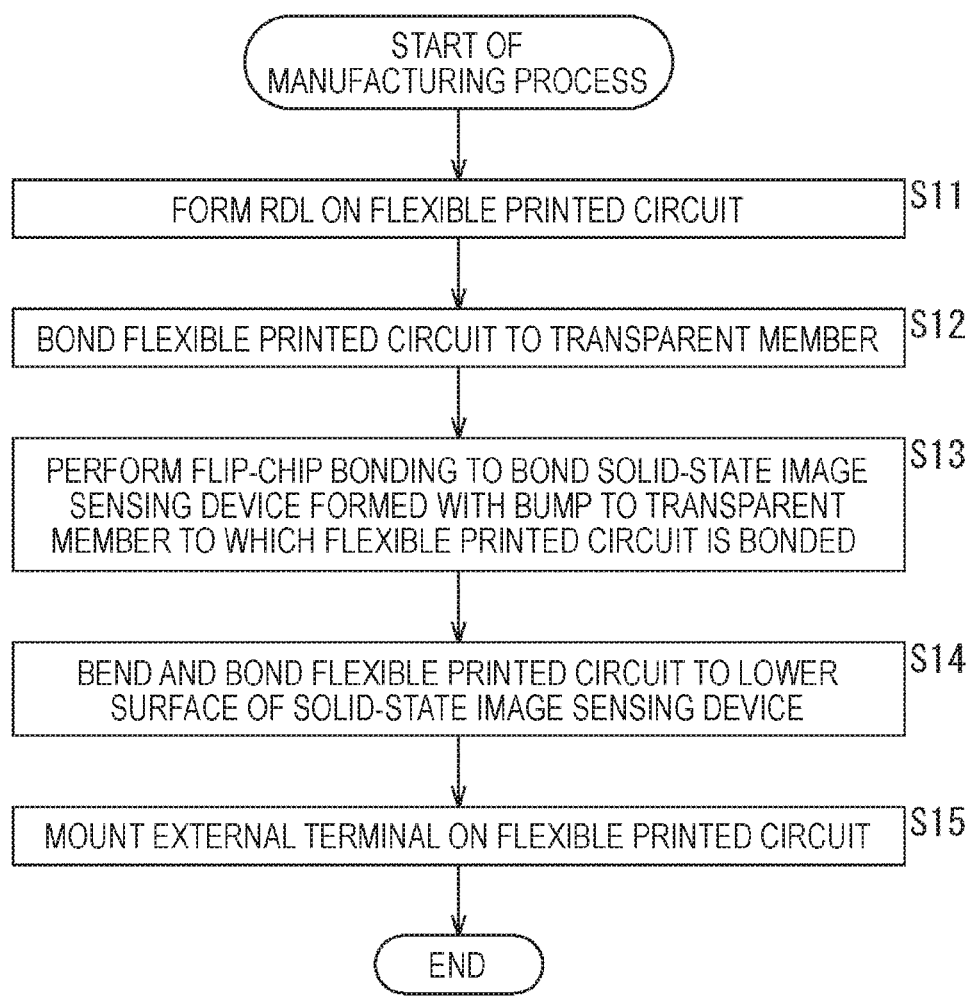
FIG. 2 is a flowchart illustrating manufacturing processes of the semiconductor device of the first embodiment.

Note that the manufacturing processes illustrated in FIG. 2 correspond to a back-end process, and the solid-state image sensor 101 is completed in a front-end process (wafer process). Additionally, FIGS. 3A, 3B, 3C, 4A, 4B, and 4C schematically illustrate the manufacturing processes in FIG. 2, and detailed content of the respective processes in FIG. 2 will be described with reference to FIGS. 3A, 3B, 3C, 4A, 4B, and 4C as appropriate.

(Redistribution Layer (RDL) Forming Process)

In step S11, a redistribution layer (RDL) forming process is performed.

Figure 3A:
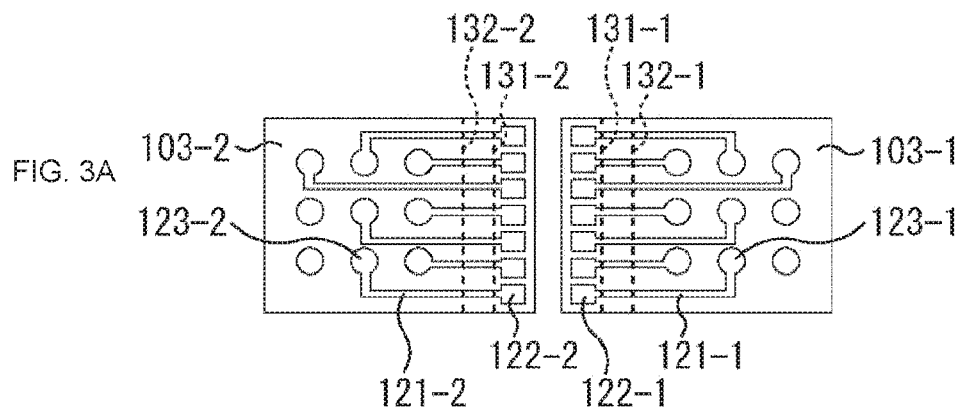
FIGS. 3A, 3B, and 3C are views to describe the respective manufacturing processes of the semiconductor device of the first embodiment.

In the redistribution layer (RDL) forming process, as illustrated in A of FIG. 3A, an RDL 121-1 is formed on the flexible printed circuit 103-1, and terminals 122-1 corresponding to the number of pad portions 106-1 of the solid-state image sensor 101 and terminals 123-1 corresponding to the number of the external terminals (BGAs) 108 are formed. Meanwhile, slits 131-1 and 132-1 are formed on the flexible printed circuit 103-1 in order to be easily bent along the respective surfaces of the solid-state image sensor 101.

In a similar manner, an RDL 121-2 is formed on the flexible printed circuit 103-2, and terminals 122-2 corresponding to the number of pad portions 106-2 of the solid-state image sensor 101 and terminals 123-2 corresponding to the number of the external terminals (BGAs) 108 are formed. Additionally, slits 131-2 and 132-2 are formed also on the flexible printed circuit 103-2.

(Circuit/Transparent Member Bonding Process)

In step S12, a circuit/transparent member bonding process is performed.

Figure 3B:
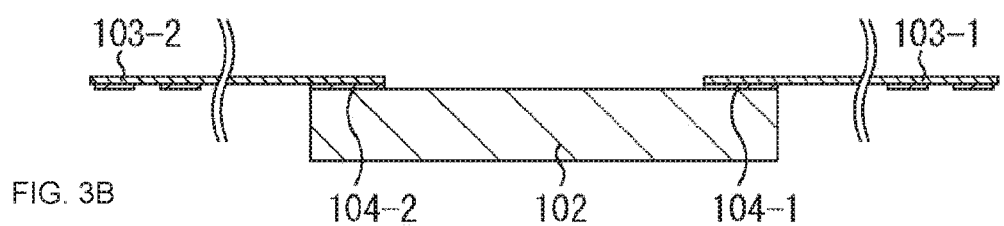

In the circuit/transparent member bonding process, as illustrated in FIG. 3B, the flexible printed circuit 103-1 formed with the RDL 121-1 is bonded (fixed) to a lower surface side of the transparent member 102 with the adhesive 104-1, and the flexible printed circuit 103-2 formed with the RDL 121-2 is bonded (fixed) to the transparent member 102 with the adhesive 104-2.

However, the terminal 122-1 is provided on a surface included in the flexible printed circuit 103-1 and located on the opposite side of the surface bonded to the transparent member 102 with the adhesive 104-1. In a similar manner, the terminal 122-2 is provided on a surface included in the flexible printed circuit 103-2 and located on the opposite side of the surface bonded to the transparent member 102 with the adhesive 104-2.

(Flip Chip Bonding Process)

In step S13, a flip chip bonding process is performed.

Figure 3C:
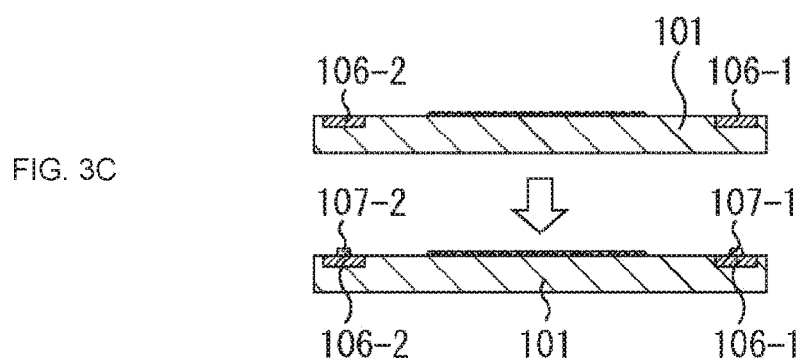

In the flip chip bonding process, as illustrated in FIG. 3C, the bump 107-1 is formed on the pad portion 106-1 provided on the light receiving surface side of the solid-state image sensor 101, and the bump 107-2 is formed on the pad portion 106-2.

Figure 4A:
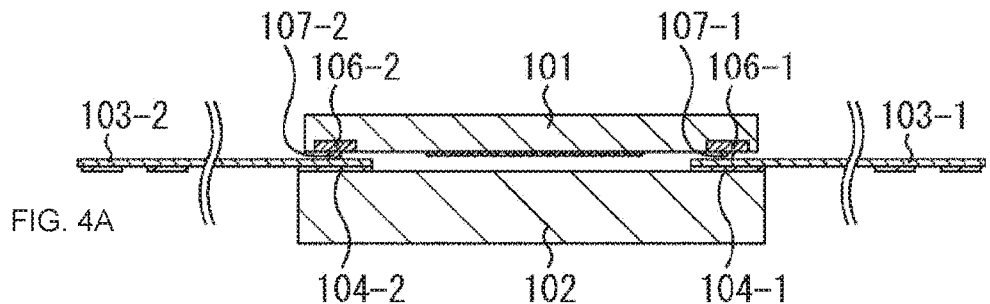
FIGS. 4A, 4B, and 4C are views to describe the respective manufacturing processes of the semiconductor device of the first embodiment.

Then, in the flip chip bonding process, as illustrated in FIG. 4A, the bump 107-1 formed on the pad portion 106-1 of the solid-state image sensor 101 is connected to the terminal 122-1 formed on the flexible printed circuit 103-1, and the bump 107-2 formed on the pad portion 106-2 of the solid-state image sensor 101 is connected to the terminal 122-2 formed on the flexible printed circuit 103-2.

For example, seven terminals 122-1 are formed (FIG. 3A) on the flexible printed circuit 103-1, and seven terminals 122-2 are formed on the flexible printed circuit 103-2 (FIG. 3A), and the pad portions 106 corresponding to the terminals 122 are provided and the bumps 107 are formed on the respective pad portions 106 in the solid-state image sensor 101, and therefore, the respective bumps 107 are connected to the terminals 122.

Thus, the flip chip bonding process is performed, and the solid-state image sensor 101 is electrically connected to the flexible printed circuit 103-1 and the flexible printed circuit 103-2 bonded to the transparent member 102.

(Circuit/Device Bonding Process)

In step S14, a circuit/device bonding process is performed.

Figure 4B:
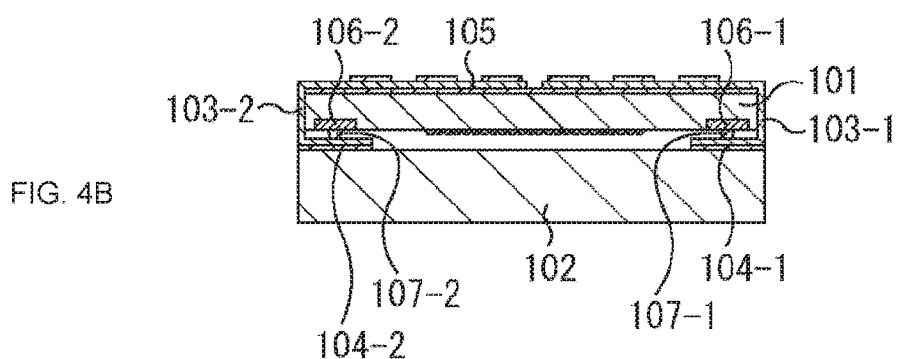

In the circuit/device bonding process, as illustrated in FIG. 4B, each of the flexible printed circuit 103-1 and the flexible printed circuit 103-2 electrically connected to the solid-state image sensor 101 and bonded to the transparent member 102 is bent along the respective surfaces (side surface (right side surface or left side surface) and the lower surface) of the solid-state image sensor 101, and is bonded (fixed) to the lower surface (back surface) of the solid-state image sensor 101 with the adhesive 105.

Specifically, as illustrated in FIG. 4B, the flexible printed circuit 103-1 bonded to the transparent member 102 is bent to the side of the right side surface of the solid-state image sensor 101 by the slit 131-1, and further bent to the lower surface side of the solid-state image sensor 101 by the slit 132-1. In a similar manner, the flexible printed circuit 103-2 bonded to the transparent member 102 is bent to the side of the left side surface of the solid-state image sensor 101 by the slit 131-2, and further bent to the lower surface side of the solid-state image sensor 101 by the slit 132-2.

Then, surfaces which are included in the flexible printed circuit 103-1 and the flexible printed circuit 103-2 bent as described above and are located on the lower surface side of the solid-state image sensor 101 are bonded to the lower surface of the solid-state image sensor 101 with the adhesive 105.

(External Terminal Mounting Process)

In step S15, an external terminal mounting process is performed.

In the external terminal mounting process, as illustrated in C of FIG. 4, an external terminal (BGA) 108 is mounted on a terminal 123-1 formed on the flexible printed circuit 103-1, and an external terminal (BGA) 108 is mounted on a terminal 123-2 formed on the flexible printed circuit 103-2.

Figure 4C:
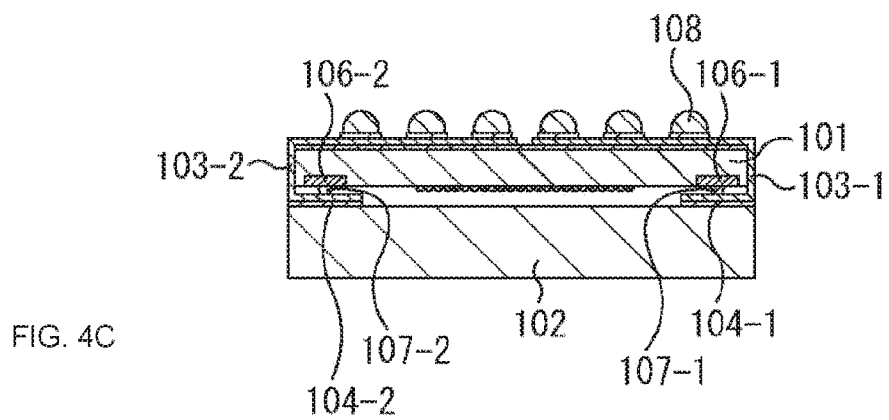

In the external terminal mounting process, as illustrated in FIG. 4C, an external terminal (BGA) 108 is mounted on a terminal 123-1 formed on the flexible printed circuit 103-1, and an external terminal (BGA) 108 is mounted on a terminal 123-2 formed on the flexible printed circuit 103-2.

For example, since 3×3 terminals 123-1 are formed on the flexible printed circuit 103-1 (FIG. 3A), totally nine external terminals (BGAs) 108 are mounted on the respective terminals 123-1. In a similar manner, for example, since 3×3 terminals 123-2 are formed on the flexible printed circuit 103-2 (FIG. 3A), totally nine external terminals (BGAs) 108 are mounted on the respective terminals 123-2. In other words, in the semiconductor device 10, totally eighteen external terminals (BGAs) 108 are mounted.

The flow of the manufacturing processes of the semiconductor device 10 of the first embodiment has been described above. In the manufacturing processes, performed are: the process of bonding (fixing), to the transparent member 102, the flexible printed circuits 103-1 and 103-2 having the wiring to connect the pad portion 106 provided on the upper surface side of the solid-state image sensor 101 to the external terminal (BGA) 108 provided on the lower surface side; and the process of electrically connecting the pad portion 106 provided on the upper surface side of the solid-state image sensor 101 to the wiring of the flexible printed circuits 103-1 and 103-2. Additionally, the semiconductor device 10 of FIG. 1 is manufactured by performing: the process of bending the flexible printed circuits 103-1 and 103-2 along the respective surfaces of the solid-state image sensor 101 such that the positions of the end portions of the flexible printed circuits located on the upper surface side of the solid-state image sensor 101 become positions different from a position in the space above the light receiving surface, and further fixing the surfaces of the flexible printed circuits located on the lower surface side of the solid-state image sensor 101 to the lower surface of the solid-state image sensor 101; and the process of mounting the external terminals (BGAs) on the flexible printed circuits 103-1 and 103-2.

2. Second Embodiment

In a first embodiment described above, a flexible printed circuit 103-1 and a flexible printed circuit 103-2 are adapted to cover left and right side surfaces (left side surface and right side surface) of a solid-state image sensor 101, but a side surface on a front side (front side surface) of the solid-state image sensor 101 and a side surface on a back side (back side surface) may also be covered with the flexible printed circuit 103-1 and the flexible printed circuit 103-2.

With adoption of such a structure, four side surfaces of the solid-state image sensor 101 are surrounded by the flexible printed circuit 103-1 and the flexible printed circuit 103-2, and therefore, the solid-state image sensor 101 can be sealed. With this structure, dust can be prevented from adhering to a pixel array unit on which a plurality of pixels is two-dimensionally arranged in the solid-state image sensor 101.

(Structure of Semiconductor Device)

FIGS. 5A, 5B, and 5C are views to describe a structure of a semiconductor device 10 of the second embodiment.

FIG. 5A illustrates top views of the semiconductor device 10. The top view on a left side out of the top view of FIG. 5A illustrates a state in which a transparent member 102 is attached in the semiconductor device 10 while the top view on a right side illustrates a state in which the transparent member 102 is detached and a light receiving surface 111 of the solid-state image sensor 101 is exposed.

Additionally, as illustrated in the top view in FIG. 5A on the right side, a flexible printed circuit 103-1 and a flexible printed circuit 103-2 are bend such that end portions thereof do not cover above the light receiving surface 111 (so as not to block incident light), in order words, such that positions of the end portions become positions different from a position in a space above the light receiving surface 111. With this structure, incident light is prevented from being blocked by the flexible printed circuit 103-1 and the flexible printed circuit 103-2 in the semiconductor device 10, and there is no need to provide openings at the flexible printed circuit 103-1 and the flexible printed circuit 103-2.

FIG. 5B is a front view of the semiconductor device 10 and is the view in a case of viewing, from a direction of an arrow F1, the semiconductor device 10 in the state where the transparent member 102 is attached illustrated in FIG. 5A on the left side. As illustrated in FIG. 5B, in the semiconductor device 10 of the second embodiment, provided is a structure in which not only a left side surface and a right side surface of the solid-state image sensor 101 but also a front side surface and a back side surface of the solid-state image sensor 101 are covered with the flexible printed circuit 103-1 and the flexible printed circuit 103-2.

FIG. 5C illustrates the structures of the flexible printed circuit 103-1 and the flexible printed circuit 103-2 in the second embodiment.

In FIG. 5C, the flexible printed circuit 103-1 is provided with a side surface bent portion 125-1 bent by a slit 133-1 and a side surface bent portion 126-1 bent by the slit 134-1. Furthermore, the flexible printed circuit 103-2 is provided with a side surface bent portion 125-2 bent by a slit 133-2 and a side surface bent portion 126-2 bent by a slit 134-2.

In a manner similar to the above-described first embodiment, the right side surface and the left side surface of the solid-state image sensor 101 can be covered by bending the flexible printed circuit 103-1 and the flexible printed circuit 103-2 having the above-described structures along the respective surfaces (upper surface, side surfaces (right side surface and left side surface), and lower surface) of the solid-state image sensor 101.

Additionally, the front side surface of the solid-state image sensor 101 can be covered by bending the side surface bent portion 125-1 by the slit 133-1 in the flexible printed circuit 103-1, and by bending the side surface bent portion 125-2 by the slit 133-2 in the flexible printed circuit 103-2. Furthermore, the back side surface of the solid-state image sensor 101 can be covered by bending the side surface bent portion 126-1 by the slit 134-1 in the flexible printed circuit 103-1, and by bending the side surface bent portion 126-2 by the slit 134-2 in the flexible printed circuit 103-2.

Thus, not only the left and right side surfaces (left side surface and right side surface) of the solid-state image sensor 101 but also the front and back side surfaces (front side surface and back side surface) can also be covered with the flexible printed circuit 103-1 and the flexible printed circuit 103-2 by bending the respective side surface bent portions of the flexible printed circuit 103-1 and the flexible printed circuit 103-2. With this structure, the four side surfaces (left side surface, right side surface, front side surface, and back side surface) of the solid-state image sensor 101 are covered with the flexible printed circuits 103, and the solid-state image sensor 101 can be sealed in the semiconductor device 10, and therefore, dust can be prevented from adhering to each of pixels arranged in a pixel array unit.

(Flow of Manufacturing Processes of Semiconductor Device)

Figure 6A:
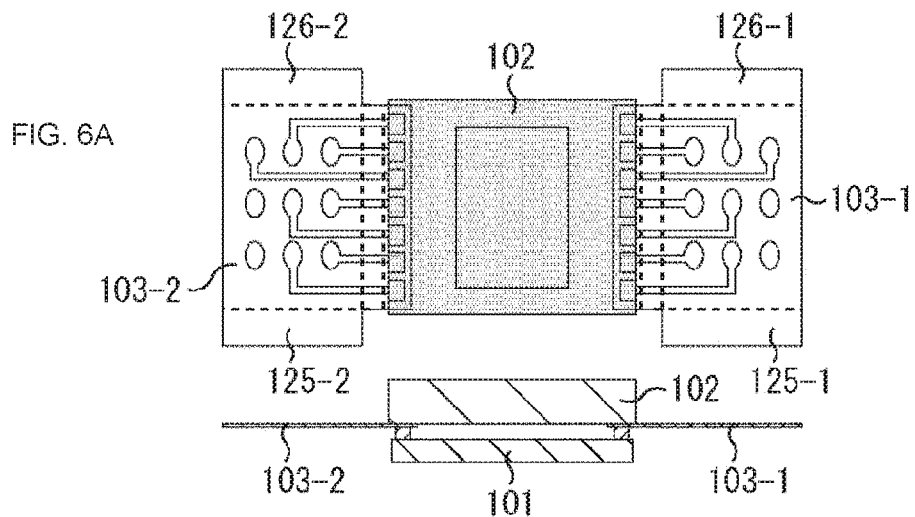
FIGS. 6A, 6B, and 6C are views to describe respective manufacturing processes of the semiconductor device of the second embodiment.
Figure 6B:
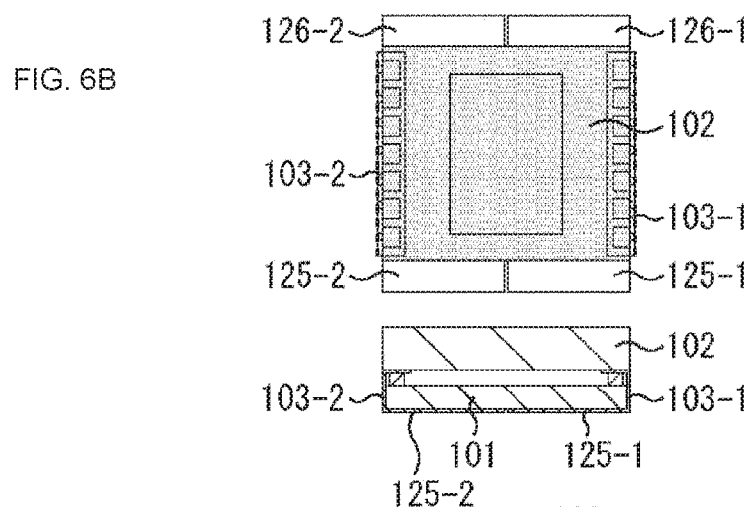
Figure 6C:
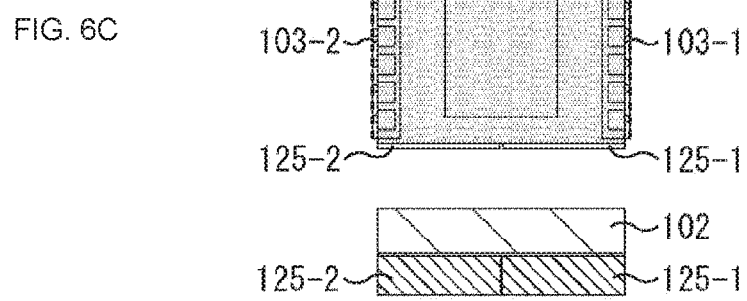

FIGS. 6A, 6B, and 6C are views to describe respective manufacturing processes of the semiconductor device 10 of the second embodiment.

Note that the manufacturing processes of the semiconductor device 10 of the second embodiment are basically performed in a flow similar to manufacturing processes of the semiconductor device 10 of the above-described first embodiment (FIG. 2), but are different in following points: the flexible printed circuits 103 are provided with the side surface bent portions 125 and 126; and the front and back side surfaces (front side surface and back side surface) of the solid-state image sensor 101 are covered with the side surface bent portions 125 and 126.

In the following, the flow of the manufacturing processes of the semiconductor device 10 of the second embodiment will be described focusing on these different points while associating schematic views in FIGS. 6A, 6B, and 6C with the respective processes (steps S11 to S15) in FIG. 2. Note that a top view and a front view of the semiconductor device 10 are illustrated in each of FIGS. 6A, 6B, and 6C.

In a manner similar to the manufacturing processes of the semiconductor device 10 of the first embodiment (FIG. 2), in the manufacturing processes of the semiconductor device 10 of the second embodiment also, a redistribution layer (RDL) forming process (S11) and a circuit/transparent member bonding process (S12) are performed, and the flexible printed circuit 103-1 formed with an RDL 121-1 is bonded (fixed) to a lower surface side of the transparent member 102 with an adhesive 104-1, and the flexible printed circuit 103-2 formed with an RDL 121-2 is bonded (fixed) to the same with an adhesive 104-2.

However, in the second embodiment, the side surface bent portion 125-1 and the side surface bent portion 126-1 are provided in the flexible printed circuit 103-1, and the side surface bent portion 125-2 and the side surface bent portion 126-2 are provided in the flexible printed circuit 103-2.

Next, in a flip chip bonding process (S13), a bump 107-1 is formed on a pad portion 106-1 provided on the light receiving surface side of the solid-state image sensor 101 and a bump 107-2 is formed on a pad portion 106-2. Then, in the flip chip bonding process (S13), as illustrated in FIG. 6A, the bump 107-1 formed on the pad portion 106-1 of the solid-state image sensor 101 is connected to a terminal 122-1 formed on the flexible printed circuit 103-1, and the bump 107-2 formed on the pad portion 106-2 of the solid-state image sensor 101 is connected to a terminal 122-2 formed on the flexible printed circuit 103-2.

Thus, the flip chip bonding process (S13) is performed, and the solid-state image sensor 101 is electrically connected to the flexible printed circuit 103-1 and the flexible printed circuit 103-2.

Next, as illustrated in FIG. 6B, in a circuit/device bonding process (S14), the flexible printed circuit 103-1 and flexible printed circuit 103-2 electrically connected to the solid-state image sensor 101 and bonded to the transparent member 102 are bent along the respective surfaces (upper surface, side surface (right side surface or left side surface), and the lower surface) of the solid-state image sensor 101, and are bonded (fixed) to the lower surface (back surface) of the solid-state image sensor 101 with an adhesive 105. With this structure, the flexible printed circuit 103-1 and the flexible printed circuit 103-2 are bent along the respective surfaces of the solid-state image sensor 101, and the left and right side surfaces (left side surface and right side surface) of the solid-state image sensor 101 are covered by the flexible printed circuits 103.

Additionally, as illustrated in FIG. 6C, in the circuit/device bonding process (S14), the side surface bent portion 125-1 and the side surface bent portion 126-1 of the flexible printed circuit 103-1 bonded to the lower surface (back surface) of the solid-state image sensor 101, and the side surface bent portion 125-2 and the side surface bent portion 126-2 of the flexible printed circuit 103-2 bonded to the same lower surface are bent to the sides of the respective side surfaces, and the front and back side surfaces (front side surface and back side surface) of the solid-state image sensor 101 are covered with the flexible printed circuits 103. With this structure, in the semiconductor device 10, the four side surfaces (left side surface, right side surface, front side surface, and back side surface) of the solid-state image sensor 101 are covered by the flexible printed circuits 103.

Next, in an external terminal mounting process (S15), in a manner similar to the manufacturing processes of the semiconductor device 10 of the first embodiment (FIG. 2), an external terminal (BGA) 108 is mounted on a terminal 123-1 formed on the flexible printed circuit 103-1 and an external terminal (BGA) 108 is mounted on a terminal 123-2 formed on the flexible printed circuit 103-2.

The manufacturing processes of the semiconductor device 10 of the second embodiment have been described above.

Thus, since the four side surfaces of the solid-state image sensor 101 are surrounded by the flexible printed circuit 103-1 and the flexible printed circuit 103-2 in the semiconductor device 10 of the second embodiment, the solid-state image sensor 101 can be sealed. With this structure, dust can be prevented from adhering to a pixel array unit on which a plurality of pixels is two-dimensionally arranged in the solid-state image sensor 101.

Additionally, in the semiconductor device 10 of the second embodiment, since incident light incident on the light receiving surface of the solid-state image sensor 101 is prevented from being blocked by the flexible printed circuit 103-1 and the flexible printed circuit 103-2 in a manner similar to the semiconductor device 10 of the first embodiment, there is no need to provide openings at the flexible printed circuit 103-1 and the flexible printed circuit 103-2.

3. Third Embodiment

In a second embodiment described above, provided is a structure in which a solid-state image sensor 101 is sealed in a manner where four side surfaces (left side surface, right side surface, front side surface, and back side surface) of the solid-state image sensor 101 are surrounded by flexible printed circuits 103, but may also have a structure in which respective surfaces of the flexible printed circuits 103 surrounding the four side surfaces of the solid-state image sensor 101 each have an arc shape having a predetermined curvature. Additionally, in a case of adopting such a structure, a space is generated at a corner portion in each of four corners of a semiconductor device 10 by forming each of the surfaces of the flexible printed circuits 103 to have the arc shape, but the solid-state image sensor 101 is sealed by using a sealing member such as a resin.

With this structure, dust can be prevented from adhering to a pixel array unit on which a plurality of pixels is two-dimensionally arranged in the solid-state image sensor 101. Additionally, since the surfaces of the flexible printed circuits 103 surrounding the four side surfaces (left side surface, right side surface, front side surface, and back side surface) of the solid-state image sensor 101 each have the arc shape, strength against external impact applied to the four side surfaces is enhanced, and therefore, the solid-state image sensor 101 can be protected from such external impact.

(Structure of Semiconductor Device)

Figure 7A:
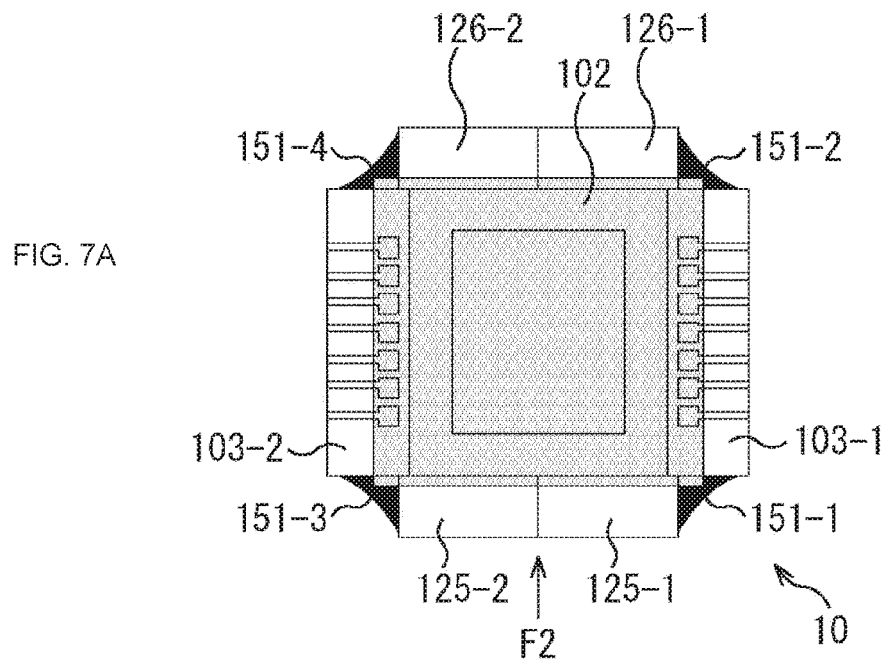
FIGS. 7A and 7B are views to describe a structure of a semiconductor device according to a third embodiment.
Figure 7B:
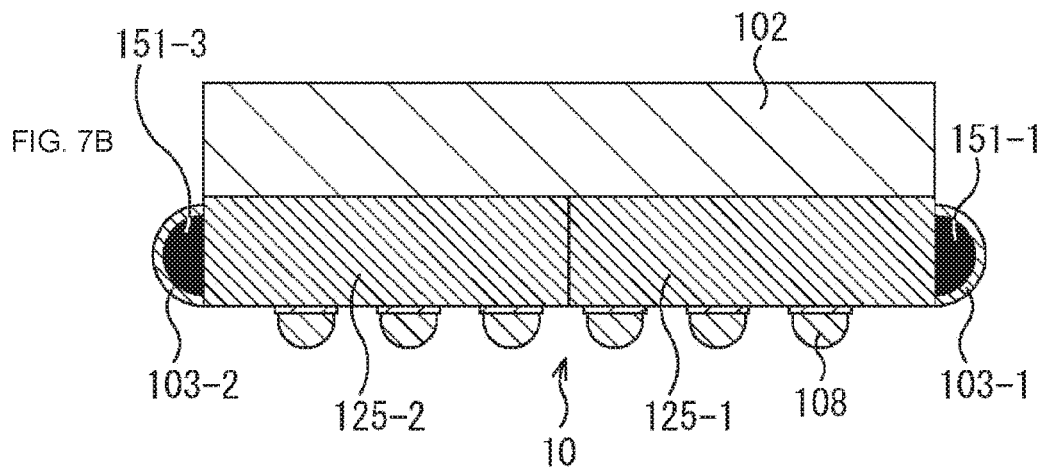

FIGS. 7A and 7B are views to describe a structure of the semiconductor device 10 of the third embodiment.

FIG. 7A is a top view of the semiconductor device 10. Additionally, FIG. 7B is a front view of the semiconductor device 10 and also is a view in a case of viewing, from a direction of an arrow F2, the semiconductor device 10 illustrated in FIG. 7A.

As illustrated in FIG. 7A, in the semiconductor device 10 of the third embodiment, a side surface bent portion 125-1 and a side surface bent portion 126-1 are provided in a flexible printed circuit 103-1, and a side surface bent portion 125-2 and a side surface bent portion 126-2 are provided in a flexible printed circuit 103-2 in a manner similar to a semiconductor device 10 of the second embodiment.

Additionally, in a manner similar to the above-described second embodiment, the right side surface and the left side surface of the solid-state image sensor 101 can be covered by bending the flexible printed circuit 103-1 and the flexible printed circuit 103-2 having the above-described structures along respective surfaces (upper surface, side surfaces (right side surface and left side surface), and lower surface) of the solid-state image sensor 101. However, in the third embodiment, the surface of the flexible printed circuit 103-1 which covers the right side surface of the solid-state image sensor 101 has the arc shape having the predetermined curvature. In a similar manner, the surface of the flexible printed circuit 103-2 which covers the left side surface of the solid-state image sensor 101 has the arc shape having the predetermined curvature.

Additionally, the front side surface of the solid-state image sensor 101 can be covered by bending the side surface bent portion 125-1 by a slit 133-1 in the flexible printed circuit 103-1, and by bending the side surface bent portion 125-2 by a slit 133-2 in the flexible printed circuit 103-2. However, in the third embodiment, the surfaces (side surface bent portion 125-1 and side surface bent portion 125-2) of the flexible printed circuit 103-1 and the flexible printed circuit 103-2 which cover the front side surface of the solid-state image sensor 101 each have the arc shape having the predetermined curvature.

Furthermore, the back side surface of the solid-state image sensor 101 can be covered by bending the side surface bent portion 126-1 by a slit 134-1 in the flexible printed circuit 103-1, and by bending the side surface bent portion 126-2 by a slit 134-2 in the flexible printed circuit 103-2. However, in the third embodiment, the surfaces (side surface bent portion 126-1 and side surface bent portion 126-2) of the flexible printed circuit 103-1 and the flexible printed circuit 103-2 which cover the back side surface of the solid-state image sensor 101 each have the arc shape having the predetermined curvature.

Thus, the four side surfaces (left side surface, right side surface, front side surface, and back side surface) of the solid-state image sensor 101 can be surrounded by the flexible printed circuits 103 by bending the respective side surface bent portions of the flexible printed circuits 103, but spaces are generated at the corner portions of the four corners of the semiconductor device 10 because each of the surfaces of the flexible printed circuits 103 has the arc shape.

Here, in the semiconductor device 10, the spaces generated at the corner portions of the four corners are sealed by using sealing members 151-1 to 151-4 such as a resin, thereby sealing the solid-state image sensor 101. With this structure, in the semiconductor device 10, the four side surfaces (left side surface, right side surface, front side surface, and back side surface) of the solid-state image sensor 101 are surrounded by the surfaces of the flexible printed circuits 103 (surfaces each formed in the arc shape having the predetermined curvature), and furthermore, the spaces generated at the corner portions of the four corners can be sealed with the sealing members 151, and therefore, dust can be prevented from adhering to each of pixels arranged in a pixel array unit.

Additionally, since the surfaces of the flexible printed circuits 103 surrounding the four side surfaces (left side surface, right side surface, front side surface, and back side surface) of the solid-state image sensor 101 each have the arc shape, strength against external impact applied to the four side surfaces is enhanced, and therefore, the solid-state image sensor 101 can be protected from such external impact.

(Flow of Manufacturing Processes of Semiconductor Device)

FIGS. 8A, 8B, 8C, and 8D are views to describe respective manufacturing processes of the semiconductor device 10 of the third embodiment.

Meanwhile, the manufacturing processes of the semiconductor device 10 of the third embodiment are performed in a flow basically similar to the flow of manufacturing processes of the semiconductor device 10 of the first embodiment described above (FIG. 2), but are different in following points: the side surface bent portions 125 and 126 are provided in the flexible printed circuits 103, and the front and back side surfaces of the solid-state image sensor 101 are surrounded by the side surface bent portions 125 and 126; the respective surfaces of the flexible printed circuits 103 surrounding the four side surfaces of the solid-state image sensor 101 each have the arc shape having the predetermined curvature; and the corner portions of the four corners are sealed with the sealing members 151.

In the following, the flow of the manufacturing processes of the semiconductor device 10 of the third embodiment will be described focusing on these different points while associating schematic views in FIGS. 8A, 8B, 8C, and 8D with the respective processes (steps S11 to S15) in FIG. 2. Note that a top view and a front view of the semiconductor device 10 are illustrated in each of FIGS. 8A, 8B, 8C, and 8D.

In a manner similar to the manufacturing processes of the semiconductor device 10 of the first embodiment (FIG. 2), in the manufacturing processes of the semiconductor device 10 of the third embodiment also, a redistribution layer (RDL) forming process (S11) and a circuit/transparent member bonding process (S12) are performed, and the flexible printed circuit 103-1 formed with an RDL 121-1 is bonded (fixed) to a lower surface side of a transparent member 102 with an adhesive 104-1, and the flexible printed circuit 103-2 formed with an RDL 121-2 is bonded (fixed) to the same with an adhesive 104-2.

However, in the third embodiment, the side surface bent portion 125-1 and the side surface bent portion 126-1 are provided in the flexible printed circuit 103-1, and the side surface bent portion 125-2 and the side surface bent portion 126-2 are provided in the flexible printed circuit 103-2.

Figure 8A:
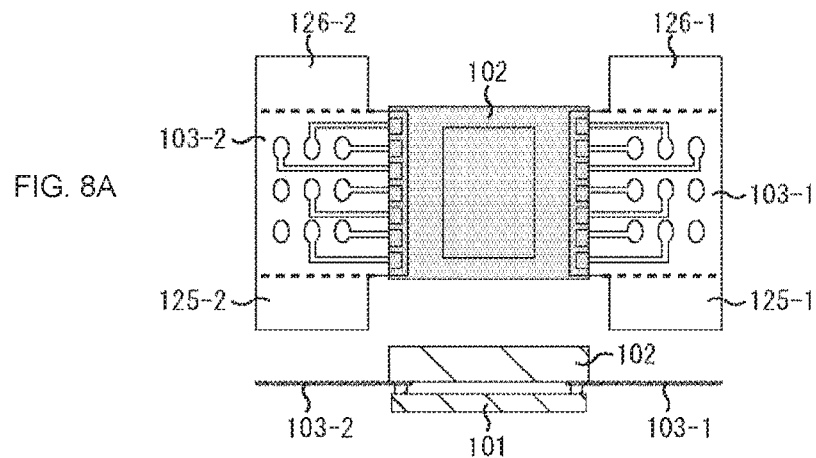
FIGS. 8A, 8B, 8C, and 8D are views to describe respective manufacturing processes of the semiconductor device of the third embodiment.

Next, in a flip chip bonding process (S13), a bump 107-1 is formed on a pad portion 106-1 provided on a light receiving surface side of the solid-state image sensor 101, and a bump 107-2 is formed on a pad portion 106-2. Then, in the flip chip bonding process (S13), as illustrated in FIG. 8A, the bump 107-1 formed on the pad portion 106-1 of the solid-state image sensor 101 is connected to a terminal 122-1 formed on the flexible printed circuit 103-1, and the bump 107-2 formed on the pad portion 106-2 of the solid-state image sensor 101 is connected to a terminal 122-2 formed on the flexible printed circuit 103-2.

Thus, the flip chip bonding process (S13) is performed, and the solid-state image sensor 101 is electrically connected to the flexible printed circuit 103-1 and the flexible printed circuit 103-2.

Figure 8B:
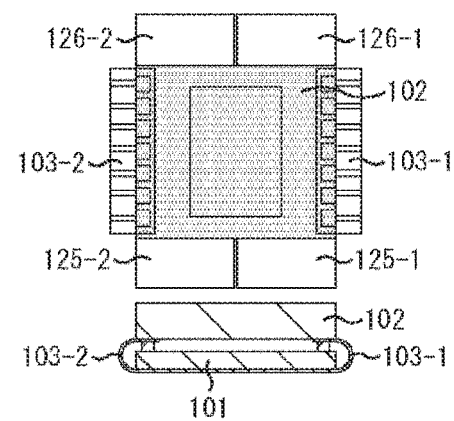

Next, as illustrated in FIG. 8B, in a circuit/device bonding process (S14), the flexible printed circuit 103-1 and the and flexible printed circuit 103-2 electrically connected to the solid-state image sensor 101 and bonded to the transparent member 102 are bent along the respective surfaces (upper surface, side surface (right side surface or left side surface), and the lower surface) of the solid-state image sensor 101, and are bonded (fixed) to the lower surface (back surface) of the solid-state image sensor 101 with an adhesive 105.

As a result, the flexible printed circuit 103-1 and the flexible printed circuit 103-2 are bent along the respective surfaces of the solid-state image sensor 101, and the left and right side surfaces (right side surface and left side surface) of the solid-state image sensor 101 are surrounded by the flexible printed circuits 103, and the respective surfaces of the flexible printed circuits 103 on the sides of the left and right side surfaces each have the arc shape having the predetermined curvature. Meanwhile, a height of the arc (arc height) can be, for example, equal to or less than a thickness of the solid-state image sensor 101.

Figure 8C:
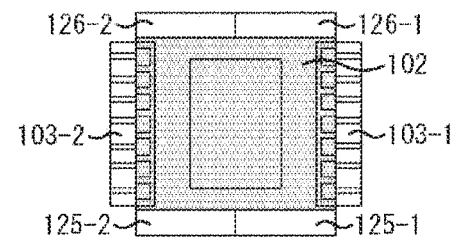

Additionally, as illustrated in FIG. 8C, in the circuit/device bonding process (S14), the side surface bent portion 125-1 and the side surface bent portion 126-1 of the flexible printed circuit 103-1 bonded to the lower surface (back surface) of the solid-state image sensor 101, and the side surface bent portion 125-2 and the side surface bent portion 126-2 of the flexible printed circuit 103-2 bonded to the same lower surface are bent to the sides of the respective side surfaces, and the front and back side surfaces (front side surface and back side surface) of the solid-state image sensor 101 are surrounded by the flexible printed circuits 103. However, the respective surfaces (side surface bent portions 125-1 and 125-2 and the side surface bent portions 126-1 and 126-2) of the flexible printed circuits 103 on the sides of the front and back side surfaces of the solid-state image sensor 101 each have the arc shape having the predetermined curvature. Note that the height of the arc can be, for example, equal to or less than the thickness of the solid-state image sensor 101.

Figure 8D:
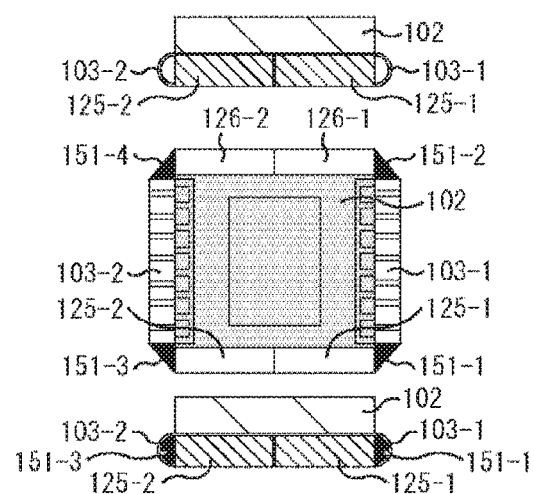

Thus, the four side surfaces (left side surface, right side surface, front side surface, and back side surface) of the solid-state image sensor 101 can be surrounded by the flexible printed circuits 103 by bending the respective side surface bent portions of the flexible printed circuits 103, but the spaces are generated at the corner portions of the four corners of the semiconductor device 10 by forming each of the surfaces of the flexible printed circuits 103 in the arc shape. Therefore, in the circuit/device bonding process (S14), as illustrated in FIG. 8D, the spaces generated at the corner portions of the four corners are sealed by using the sealing members 151-1 to 151-4 such as a resin.

Next, in an external terminal mounting process (S15), in a manner similar to the manufacturing processes of the semiconductor device 10 of the first embodiment (FIG. 2), an external terminal (BGA) 108 is mounted on a terminal 123-1 formed on the flexible printed circuit 103-1 and an external terminal (BGA) 108 is mounted on a terminal 123-2 formed on the flexible printed circuit 103-2.

The manufacturing processes of the semiconductor device 10 of the third embodiment have been described above.

Thus, in the semiconductor device 10 of the third embodiment, since the surfaces of the flexible printed circuits 103 surrounding the four side surfaces (left side surface, right side surface, front side surface, and back side surface) of the solid-state image sensor 101 each have the arc shape having the predetermined curvature, strength against external impact applied to the four side surfaces is enhanced, and therefore, the solid-state image sensor 101 can be protected from such external impact.

Additionally, the spaces are generated at the corner portions of the four corners of the semiconductor device 10 by forming each of the surfaces of the flexible printed circuits 103 in the arc shape, but since the solid-state image sensor 101 is sealed by using the sealing members 151-1 to 151-4 such as a resin, dust can be prevented from adhering to the pixel array unit in which a plurality of pixels are two-dimensionally arranged in the solid-state image sensor 101.

Meanwhile, in the above-described first to third embodiments, the case of using the two flexible printed circuits 103 (flexible printed circuits 103-1 and 103-2) has been described as an example, but the present technology is not limited by the number of flexible printed circuits 103, and one or three or more flexible printed circuits 103 may be used as far as the above-described functions can be implemented. Furthermore, in the third embodiment, the spaces formed at the corner portions of the four corners of the semiconductor device 10 are sealed by using the sealing members 151-1 to 151-4, but the spaces are not necessarily sealed. In this case, the solid-state image sensor 101 cannot be sealed, but the solid-state image sensor 101 can be protected from external impact because the surfaces of the flexible printed circuits 103 surrounding the four side surfaces of the solid-state image sensor 101 each have the arc shape. Additionally, it is not necessary to form all of the surfaces of the flexible printed circuits 103 surrounding the four side surfaces of the solid-state image sensor 101 in the arc shape, and only part of the surfaces may have formed in the arc shape.

4. Configuration of Electronic Apparatus

Figure 9:
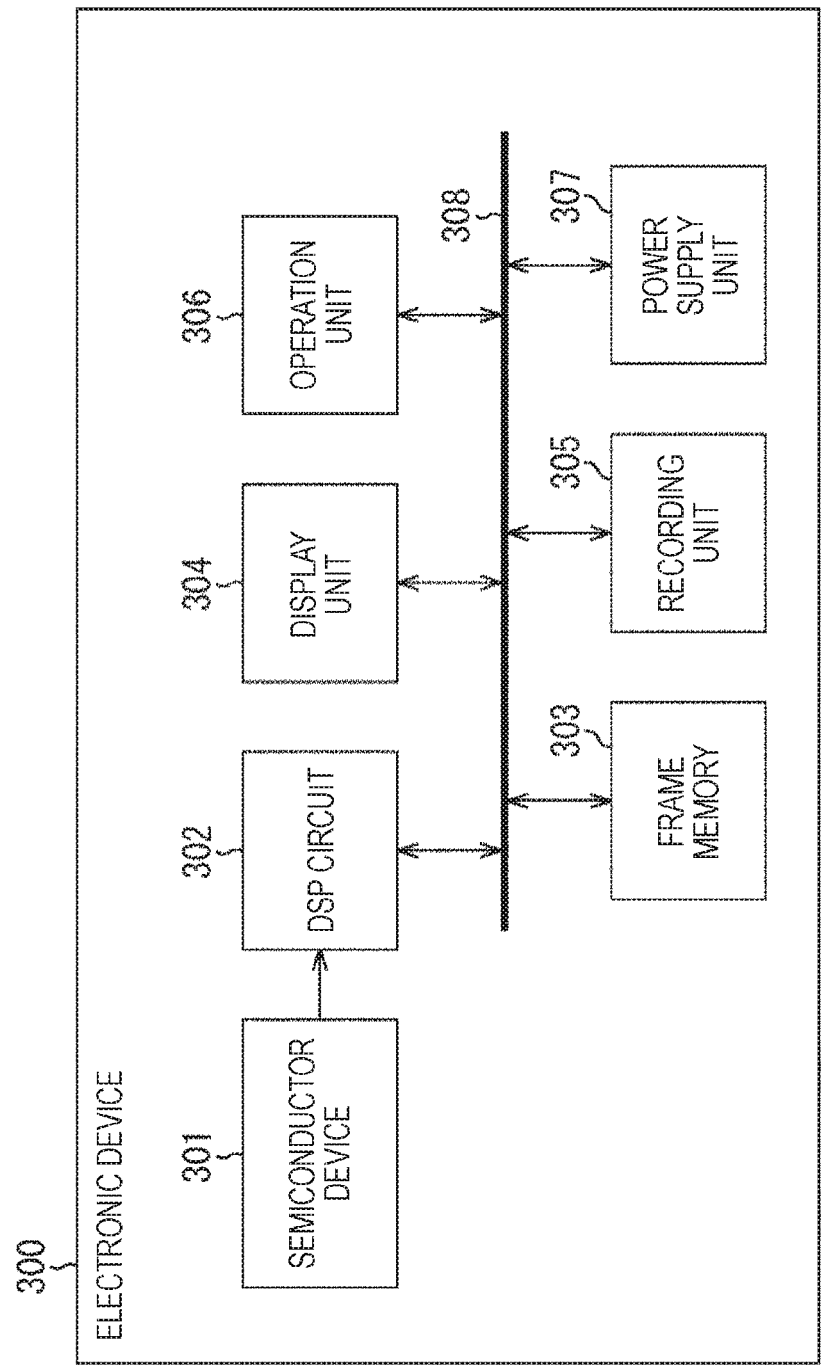

FIG. 9 is a diagram illustrating an exemplary configuration of an electronic apparatus 300 having a semiconductor device in which the present technology is applied.

The electronic apparatus 300 in FIG. 9 is an electronic apparatus such as an imaging device like a digital still camera or a video camera, or a portable terminal device like a smartphone or a tablet type terminal.

In FIG. 9, the electronic apparatus 300 includes a semiconductor device 301, a DSP circuit 302, a frame memory 303, a display unit 304, a recording unit 305, an operation unit 306, and a power supply unit 307. Additionally, the DSP circuit 302, frame memory 303, display unit 304, recording unit 305, operation unit 306, and power supply unit 307 are mutually connected via a bus line 308 in the electronic apparatus 300.

The semiconductor device 301 corresponds to a semiconductor device 10 of first to third embodiments, and has a cross-sectional structure of FIG. 1, for example.

The DSP circuit 302 is a camera signal processing circuit to process a signal supplied from (a solid-state image sensor 101 of) the semiconductor device 301. The DSP circuit 302 outputs image data obtained by processing a signal from the semiconductor device 301. The frame memory 303 temporarily holds, per frame, image data processed by the DSP circuit 302.

The display unit 304 includes, for example, a panel type display device such as a liquid crystal panel or an organic electro luminescence (EL) panel, and displays a moving image or a still image captured by (the solid-state image sensor 101 of) the semiconductor device 301. The recording unit 305 records image data of a moving image or a still image captured by (the solid-state image sensor 101 of) the semiconductor device 301 on a recording medium such as a semiconductor memory or a hard disk.

The operation unit 306 outputs operation commands for various functions held by the electronic apparatus 300 in accordance with operation by a user. The power supply unit 307 suitably supplies various kinds of power supply to be operation power sources of the DSP circuit 302, frame memory 303, display unit 304, recording unit 305, and operation unit 306 to these supply targets.

The electronic apparatus 300 has the configured as described above.

5. Exemplary Uses of Semiconductor Device

Figure 10:
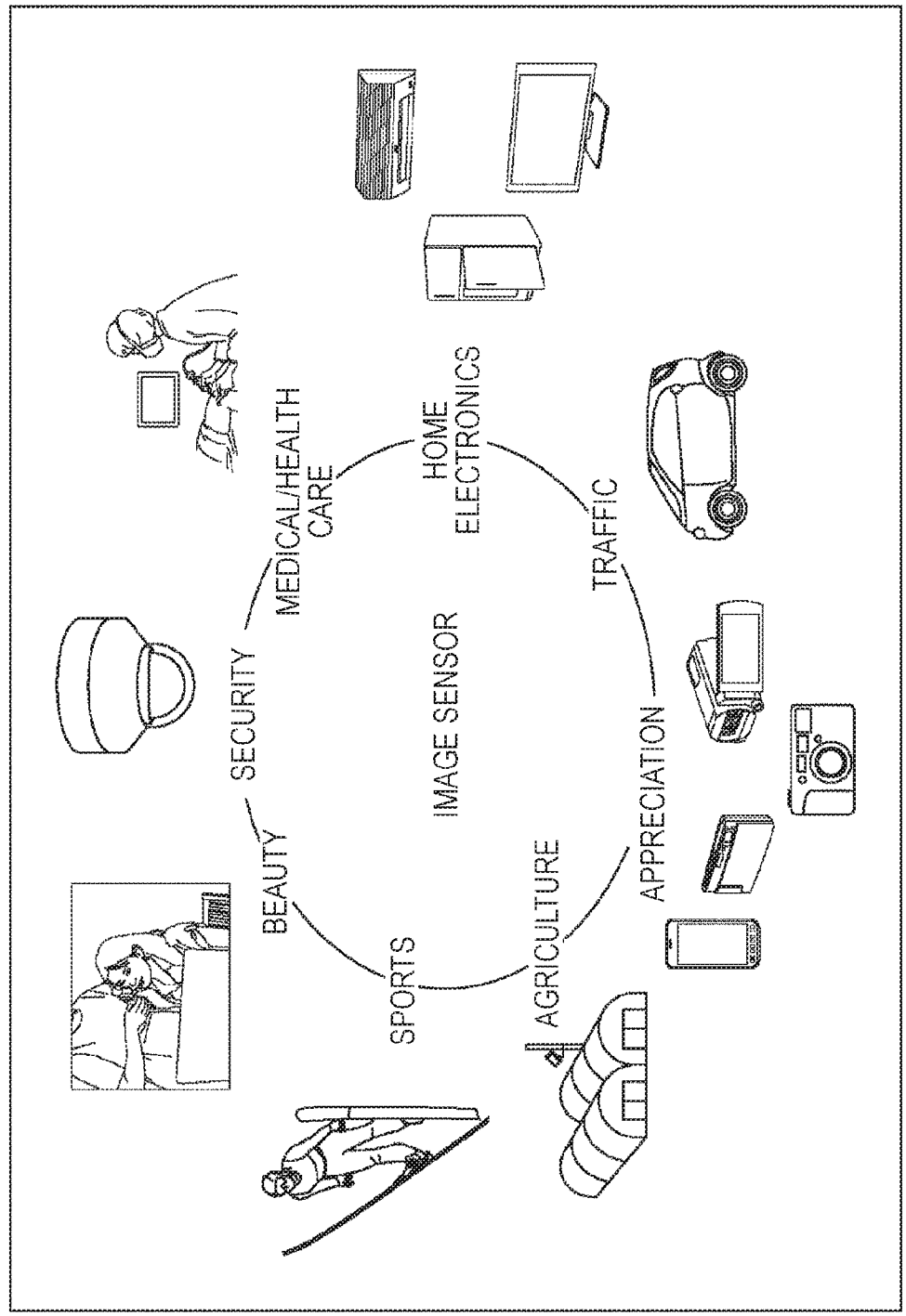

FIG. 10 is a diagram illustrating exemplary uses of a semiconductor device 10 including the solid-state image sensor 101 as an image sensor.

For example, the above-described semiconductor device 10 can be used in various cases of sensing light such as visible light, infrared light, ultraviolet light, and X-rays as described below. In other words, as illustrated in FIG. 10, the semiconductor device 10 can be used in devices used not only in a field of appreciation in which images for appreciation are photographed, but also in a field of traffic, a field of home electronics, a field of medical/health care, a field of security, a field of beauty, a field of sports, a field of agriculture, or the like, for example.

Specifically, in the field of appreciation, the semiconductor device 10 can be used in a device (e.g., an electronic apparatus 300 in FIG. 9) such as a digital camera, a smartphone, a cellular phone provided with a camera function in order to photograph images for appreciation as described above.

In the field of traffic, for example, the semiconductor device 10 can be used in a device provided for traffic, such as an on-vehicle sensor to image a front side, a back side, a periphery of a vehicle, a car interior, etc., a monitoring camera to monitor a traveling vehicle and a road, or a ranging sensor to measure a distance between vehicles in order to perform safety drive such as automatic stop, recognize driver's condition and the like.

In the field of home electronics, for example, the semiconductor device 10 can be used in a device provided in home electronics, such as a television receiver, a refrigerator, and an air conditioner in order to photograph a user's gesture and operate the device in accordance with the gesture. Additionally, in the field of medical/health care, for example, the semiconductor device 10 can be used in a device provided for medical or health care, such as an endoscope or a device to photograph a blood vessel by receiving infrared light.

In the field of security, for example, the semiconductor device 10 can be used in a device provided for security, such as a security camera for crime prevention or a camera for person authentication. Additionally, in the field of beauty, for example, the semiconductor device 10 can be used in a device provided for beauty purposes, such as a skin measuring device to photograph a skin or a microscope to photograph a scalp.

In the field of sports, for example, the semiconductor device 10 can be used in a device provided for sports, such as an action camera or a wearable camera intended for sports use and the like. Furthermore, in the field of agriculture, for example, the semiconductor device 10 can be used in a device provided for agricultural use, such as a camera to monitor condition of fields and crops.

Meanwhile, the embodiments of the present technology are not limited to the above-described embodiments, and various kinds of modifications can be made within a range without departing from a gist of the present technology. For example, an embodiment in combination of all or part of the above-described plurality of embodiments can be adopted.

Furthermore, the present technology can also have following configurations.

(1) A semiconductor device including:

a solid-state image sensor having a pixel array unit in which a plurality of pixels each having a photoelectric conversion element is two-dimensionally arranged in a matrix; and a flexible printed circuit having wiring adapted to connect a pad portion provided on an upper surface side to be located on a light receiving surface side of the solid-state image sensor to an external terminal provided on a lower surface side opposite to the upper surface side, in which the flexible printed circuit is arranged along respective surfaces of the solid-state image sensor such that a position of an end portion located on the upper surface side becomes a position different from a position in a space above the light receiving surface.

(2) The semiconductor device recited in (1), in which the flexible printed circuit includes a first flexible printed circuit and a second flexible printed circuit, the first flexible printed circuit is bent along an upper surface, one side surface out of four side surfaces, and a lower surface of the solid-state image sensor, and the second flexible printed circuit is bent along the upper surface, a side surface on an opposite side of the one side surface out of the four side surfaces, and the lower surface of the solid-state image sensor.

(3) The semiconductor device recited in (2), further including a transparent member adapted to transmit light incident on the light receiving surface, in which the first flexible printed circuit has a partial region of one surface fixed to the solid-state image sensor, and has a partial region of the other surface fixed to the transparent member, and the second flexible printed circuit has a partial region of one surface fixed to the solid-state image sensor, and has a partial region of the other surface fixed to the transparent member.

(4) The semiconductor device recited in (3), in which the first flexible printed circuit has a first side surface bent portion to be bent along two other side surfaces out of the four side surfaces of the solid-state image sensor in order to seal the solid-state image sensor, and the second flexible printed circuit has a second side surface bent portion along two other side surfaces out of the four side surfaces of the solid-state image sensor in order to seal the solid-state image sensor.

(5) The semiconductor device recited in (4), in which surfaces bent along the four side surfaces of the solid-state image sensor are each formed in an arc shape having a predetermined curvature in the first flexible printed circuit and the second flexible printed circuit.

(6) The semiconductor device recited in (5), further including a sealing member adapted to seal spaces generated by forming, in the arc shape having the predetermined curvature, each of the surfaces bent along the four side surfaces of the solid-state image sensor.

(7) The semiconductor device recited in (6), in which the sealing member is a resin.

(8) The semiconductor device recited in any one of (2) to (7), in which a slit is formed in a portion to be bent in each of the first flexible printed circuit and the second flexible printed circuit.

(9) A manufacturing method for a semiconductor device, including:

fixing a flexible printed circuit to a transparent member adapted to transmit light incident on a light receiving surface, the flexible printed circuit having wiring adapted to connect a pad portion provided on an upper surface side to be located on a light receiving surface side of a solid-state image sensor to an external terminal provided on a lower surface side opposite to the upper surface side;

electrically connecting the pad portion provided in the solid-state image sensor to the wiring of the flexible printed circuit;

bending the flexible printed circuit along respective surfaces of the solid-state image sensor such that a position of an end portion located on the upper surface side becomes a position different from a position in a space above the light receiving surface, and further fixing a surface located on the lower surface side of the solid-state image sensor to the lower surface of the solid-state image sensor; and mounting the external terminal on the flexible printed circuit.

(10) An electronic apparatus including a semiconductor device including:

a solid-state image sensor having a pixel array unit in which a plurality of pixels each having a photoelectric conversion element is two-dimensionally arranged in a matrix; and a flexible printed circuit having wiring adapted to connect a pad portion provided on an upper surface side to be a light receiving surface side of the solid-state image sensor to an external terminal provided on a lower surface side opposite to the upper surface side;

in which the flexible printed circuit is arranged along respective surfaces of the solid-state image sensor such that a position of an end portion located on the upper surface side of the solid-state image sensor differs from a position in a space above the light receiving surface.

REFERENCE SIGNS LIST

10 Semiconductor device
101 Solid-state image sensing device
102 Transparent member
103, 103-1, 103-2 Flexible printed circuit
104-1, 104-2 Adhesive
105 Adhesive
106-1, 106-2 Pad portion
107-1, 107-2 Bump
108 External terminal
125-1, 125-2, 126-1, 126-2 Side surface bent portion
151-1, 151-2, 151-3, 151-4 Sealing member
300 Electronic apparatus
301 Semiconductor device

The invention claimed is:

1. A semiconductor device, comprising:
a solid-state image sensor, wherein the solid-state image sensor includes a pixel array unit and a pad portion, wherein
the pixel array unit includes a plurality of pixels in a two-dimensional matrix, and
each of the plurality of pixels includes a photoelectric conversion element;
a first flexible printed circuit;
an external terminal;
a bump on the pad portion and on an upper surface of a plurality of surfaces of the solid-state image sensor;
a first terminal on an upper surface of the first flexible printed circuit, wherein
the first terminal is different from the external terminal,
the first terminal is electrically connected to the bump,
each of the pad portion and the first flexible printed circuit is in contact with the bump,
the first flexible printed circuit includes a wiring,
the wiring is configured to connect the bump of the semiconductor device to the external terminal of the semiconductor device,
the first flexible printed circuit is bent along the upper surface of the plurality of surfaces of the solid-state image sensor, an entire first side surface of the plurality of surfaces of the solid-state image sensor, and a first portion of a lower surface of the plurality of surfaces of the solid-state image sensor,
the first flexible printed circuit is in contact with the entire first side surface of the solid-state image sensor,
an end portion of the first flexible printed circuit is on the upper surface of the plurality of surfaces of the solid-state image sensor,
a position of the end portion of the first flexible printed circuit is different from a position in a space above a light receiving surface of the plurality of surfaces of the solid-state image sensor,
the upper surface of the solid-state image sensor corresponds to the light receiving surface of the solid-state image sensor,
the external terminal is on the lower surface of the plurality of surfaces of the solid-state image sensor, and
the lower surface of the solid-state image sensor is opposite to the upper surface of the solid-state image sensor;
a second flexible printed circuit, wherein the second flexible printed circuit is bent along the upper surface of the solid-state image sensor, an entire second side surface of the plurality of surfaces of the solid-state image sensor, and a second portion of the lower surface of the solid-state image sensor,
the second flexible printed circuit is in contact with the entire second side surface of the solid-state image sensor, and
the second side surface of the solid-state image sensor is opposite to the first side surface of the solid-state image sensor;
a transparent member configured to transmit light incident on the light receiving surface of the solid-state image sensor, wherein
a first surface of the first flexible printed circuit is fixed to a surface of the transparent member, and
the surface of the transparent member is opposite to the light receiving surface of the solid-state image sensor; and
a first adhesive configured to bond a second surface of the first flexible printed circuit to the first portion of the lower surface of the solid-state image sensor, wherein the upper surface of the first flexible printed circuit corresponds to the second surface of the first flexible printed circuit.

2. The semiconductor device according to claim 1, wherein
a region of the second surface of the first flexible printed circuit is fixed to the solid-state image sensor,
a region of a first surface of the second flexible printed circuit is fixed to the solid-state image sensor, and
a region of a second surface of the second flexible printed circuit is fixed to the transparent member.

3. The semiconductor device according to claim 2, wherein the first flexible printed circuit has a first side surface bent portion to be bent along two side surfaces out of four side surfaces of the solid-state image sensor in order to seal the solid-state image sensor, and the second flexible printed circuit has a second side surface bent portion along two other side surfaces out of the four side surfaces of the solid-state image sensor in order to seal the solid-state image sensor.

4. The semiconductor device according to claim 1, wherein a bent portion of each of the first flexible printed circuit and the second flexible printed circuit comprises a slit.

5. The semiconductor device according to claim 1, wherein the first adhesive is further configured to bond a first surface of the second flexible printed circuit to the second portion of the lower surface of the solid-state image sensor.

6. The semiconductor device according to claim 1, further comprising a second adhesive configured to fix the first surface of the first flexible printed circuit to the surface of the transparent member.

* * * * *